United States Patent
Arnold et al.

(10) Patent No.: US 10,977,401 B1
(45) Date of Patent: Apr. 13, 2021

(54) PREPARATION OF CIRCUIT DESIGNS FOR SYSTEM-ON-CHIP DEVICES AND IMPLEMENTATION OF CIRCUITRY USING INSTANCES OF A LOGICAL NETWORK-ON-CHIP

(71) Applicant: Xilinx, Inc., San Jose, CA (US)

(72) Inventors: Jeffrey M. Arnold, San Diego, CA (US); Stephen L. Bade, Lindon, UT (US); Srinivas Beeravolu, Los Gatos, CA (US); Chukwuweta Chukwudebe, Milpitas, CA (US); Anindita Patra, Fremont, CA (US); Nabeel Shirazi, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/724,553

(22) Filed: Dec. 23, 2019

(51) Int. Cl.
  *G06F 30/327* (2020.01)
  *G06F 30/343* (2020.01)
  *G06F 30/398* (2020.01)

(52) U.S. Cl.
  CPC .......... *G06F 30/327* (2020.01); *G06F 30/343* (2020.01); *G06F 30/398* (2020.01)

(58) Field of Classification Search
  CPC ..... G06F 30/327; G06F 30/343; G06F 30/398
  See application file for complete search history.

(56) References Cited

U.S. PATENT DOCUMENTS

| | | | |
|---|---|---|---|
| 9,946,826 B1* | 4/2018 | Atsatt | G06F 30/34 |
| 2008/0024165 A1* | 1/2008 | Madurawe | H03K 19/1778 326/41 |
| 2014/0126572 A1* | 5/2014 | Hutton | H04L 41/0893 370/360 |
| 2018/0165400 A1* | 6/2018 | Feld | G06F 30/392 |

OTHER PUBLICATIONS

Hoplite: Building Austere Overlay NoCs for FPGAs, Nachiket Kapre, jan Gray, 25th International Conference on Field-Programmable Logic and Applications, Sep. 2015.

* cited by examiner

Primary Examiner — Vuthe Siek
(74) Attorney, Agent, or Firm — Crawford Maunu PLLC (57) ABSTRACT

Disclosed approaches for creating a circuit design involving a network-on-chip (NoC) include instantiating in a memory of a computer system logic blocks and logical NoC (LNoC) blocks. Each logic block specifies a function of the circuit design and is communicatively coupled to another logic block through an LNoC block. The LNoC blocks are aggregated into a traffic specification that specifies connections between ingress circuits and egress circuits of the NoC. The traffic specification is compiled into configuration parameters for circuits of the NoC, and the logic blocks are compiled into implementation data for the target IC by the computer processor. The target IC can then be configured with the configuration parameters and implementation data.

20 Claims, 5 Drawing Sheets

PREPARATION OF CIRCUIT DESIGNS FOR SYSTEM-ON-CHIP DEVICES AND IMPLEMENTATION OF CIRCUITRY USING INSTANCES OF A LOGICAL NETWORK-ON-CHIP

TECHNICAL FIELD

The disclosure generally relates to preparing circuit designs targeted to system-on-chip devices.

BACKGROUND

Circuit designs involving modules communicating over a network-on-chip (NoC) can be difficult to comprehend, and preparing and managing circuit designs involving an NoC can be cumbersome. An NoC supports multiple, concurrent communications paths, and each communication path traverses a route from one of many ingress points to one or more egress points. The NoC is conventionally presented to the designers as a monolithic component having a port for every ingress point and every egress point of the NoC. A circuit design can connect numerous subsystems and modules. For a large NoC having many endpoints (ingress points and egress points) and paths assigned to many different modules of a circuit design, the NoC representation can grow so large that comprehending the connections can be difficult.

The monolithic nature of the NoC can make reconciliation of multiple designs from different design teams difficult for integration into a single device. In order to integrate the different portions from the different design teams into a consolidated design, each design team must consider all the NoC routes of all the other design teams.

SUMMARY

A disclosed method includes instantiating in a memory of a computer system by a computer processor in response to user input, a plurality of logic blocks and a plurality of logical network-on-chip (LNoC) blocks. Each logic block specifies a function of a circuit design, and each logic block is communicatively coupled to another logic block through an LNoC block of the plurality of LNoC blocks. The computer processor can aggregate the plurality of LNoC blocks into a traffic specification in the memory. The traffic specification specifies connections between ingress circuits and egress circuits of an NoC of a target integrated circuit (IC) device. The traffic specification can be compiled by the computer processor into configuration parameters for switch circuits of the NoC, and the logic blocks can be compiled into implementation data for the target IC. The target IC can be configured with the configuration parameters and implementation data.

A disclosed system includes a computer processor and a memory arrangement coupled to the computer processor. The memory arrangement is configured with instructions that when executed by the computer processor cause the computer processor to perform operations including instantiating in the memory in response to user input, a plurality of logic blocks and a plurality of logical network-on-chip (LNoC) blocks. Each logic block specifies a function of a circuit design, and each logic block is communicatively coupled to another logic block through an LNoC block of the plurality of LNoC blocks. Execution of instructions cause the computer processor to aggregate the plurality of LNoC blocks into a traffic specification. The traffic specification specifies connections between ingress circuits and egress circuits of an NoC of a target integrated circuit (IC) device. Execution of the instructions cause the computer processor to compile the traffic specification into configuration parameters for circuits of the NoC, and to compile the logic blocks into implementation data for the target IC. Further instructions executed by the computer processor cause the computer processor to configure the target IC with the configuration parameters and implementation data.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

In this discussion, a circuit design is expressed as a set of connected components, or blocks, each of which can be configured and can have sub-blocks. This design description is then synthesized into a circuit that can be used on a target device. When a network-on-chip is expressed as a single component in such a design description, the NoC component will connect to many different and unrelated other components, causing routing paths in the design to all be shown as going through a single component. The disclosed approaches provide circuit designers with logical network-on-chip (LNoC) blocks (abbreviated as "LNoCs") as design components that can be instantiated in a design and can communicatively couple other components of the design. Rather than presenting the NoC of the target device to the designer as a monolithic component, a circuit design tool allows a designer to specify individual LNoCs for coupling components. Each LNoC can specify a subset of paths through the NoC of the target device, instead of having all NoC paths going through a single monolithic NoC component.

The design approach provided by LNoCs enables separate development activities by different design teams without exposing the full specification of the entire NoC to the different design teams. LNoCs can be instantiated in different levels of the design hierarchy and can connect components in the different levels. Also, LNoCs reduce clutter on the design canvas by depicting representations of only the subset of NoC paths that connect the displayed components. LNoCs can facilitate sharing of NoC resources across static and dynamic regions of a target programmable logic device in support of designs involving partial reconfiguration.

According to the disclosed approaches, a circuit design tool can be operated to instantiate logic blocks and LNoCs that communicatively couple the logic blocks. The LNoCs and logic blocks can be selected from a library of components that is provided by the design tool, for example. The logic blocks can have associated hardware description language (HDL) specifications that can be compiled into implementation data for configuring programmable logic or constructing application-specific integrated circuitry.

When the design is complete, the specification of the NoC, including connectivity, Quality of Service (QoS) requirements, and other configuration, is captured in a "Traffic Specification", or "traffic spec." The traffic spec is passed to a "NoC compiler" which will find configuration settings for the NoC to implement all requested routes through the NoC. This configuration can then be used to program the device. When using multiple LNoC blocks, there is only one final traffic spec that describes the complete design of the NoC. This is made by the design tool by aggregating the NoC description from all LNoCs in the design into one description. In this disclosure the software component that aggregates the NoC description from each LNoC is called the aggregator. The design tool can compile the traffic specification into configuration parameters for switch circuits of an NoC of a target integrated circuit (IC) device, and can compile the logic blocks into implementation data for the target IC.

Structure of the Network on Chip

The following discusses the physical structure of the NoC in the SoC.

Figure 1:
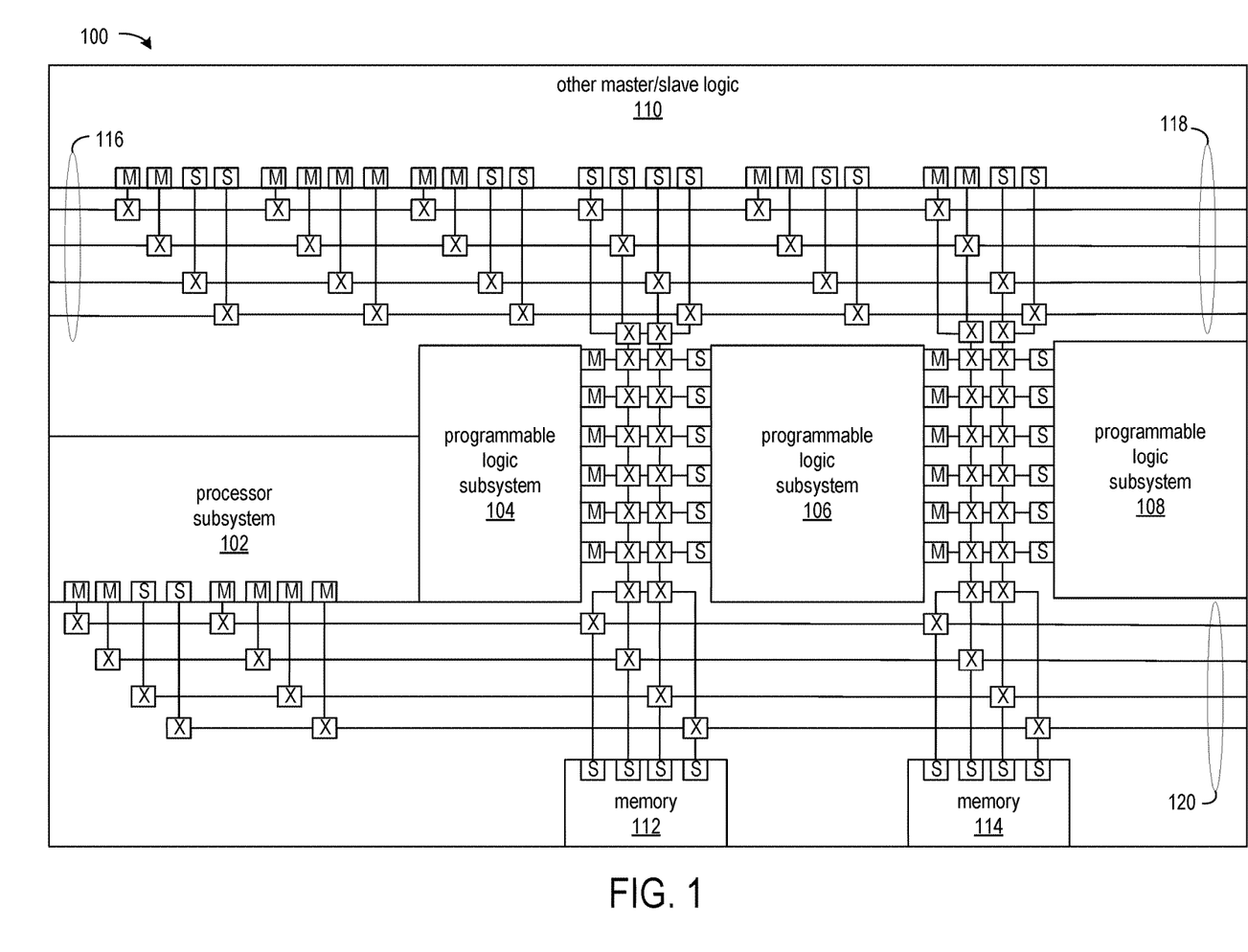
FIG. 1 shows an exemplary programmable integrated circuit (IC) having an NoC that can be configured based on connection specified by LNoCs in high-level circuit design.

FIG. 1 shows an exemplary programmable integrated circuit (IC) 100 having an NoC that can be configured based on connection specified by LNoCs in high-level circuit design. The programmable IC may also be referred to as a system-on-chip (SoC) that includes field programmable gate array logic (FPGA) along with other programmable resources. FPGA logic may include several different types of programmable logic blocks in the array. For example, FIG. 1 illustrates programmable IC 100 that includes a processor subsystem 102 and a programmable logic subsystem shown as blocks 104, 106, and 108. The programmable IC further includes other master circuits and slave circuits 110 and memory circuits 112 and 114. The other master and slave circuits 110 can provide interfaces to specialized arithmetic circuits, for example. Though not shown, the programmable IC can also include multi-gigabit transceivers (MGTs), random access memory blocks (BRAMs), input/output blocks (IOBs), configuration and clocking logic (CONFIG/CLOCKS), specialized input/output blocks (I/O), digital clock managers, analog-to-digital converters, system monitoring logic, specialized computation blocks (e.g., encoders, decoders, processors, etc.), and so forth.

Figure 5:
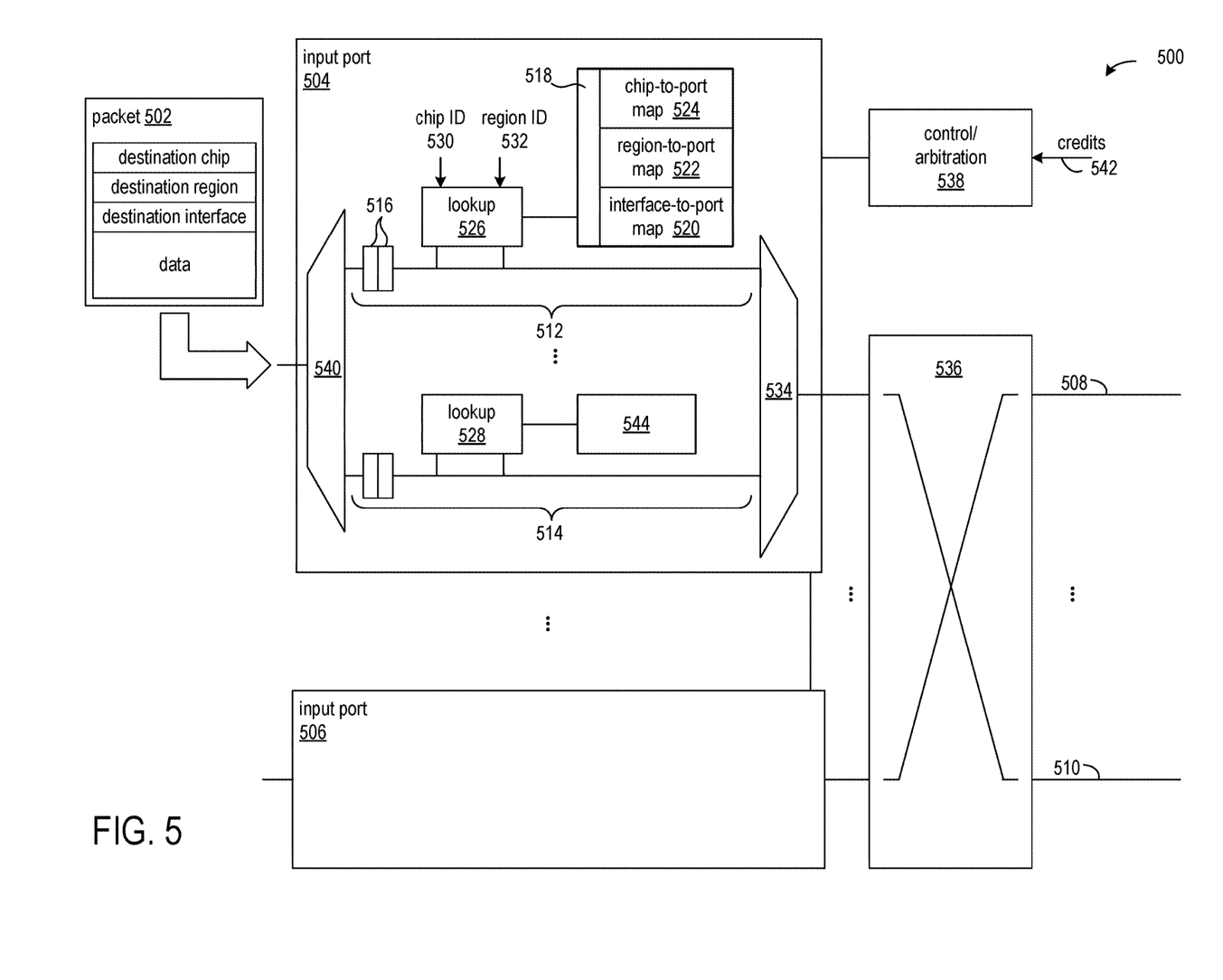
FIG. 5 shows an exemplary switch circuit for routing packets within an NoC.

The processor subsystem 102, programmable logic subsystem 104, 106, and 108, other master and slave circuits 110, and memory circuits 112 and 114 are communicatively coupled via an NoC. The NoC includes multiple switches, which are illustrated as small blocks having "X"s. Each of the switches of the exemplary programmable IC and NoC is connected to one or more other switches and/or to an NoC interface circuit. In the exemplary programmable IC, the NoC interface circuits are illustrated as small blocks labelled "M" and "S," respectively. A switch circuit that can be used in the NoC of FIG. 1 is shown in FIG. 5.

The NoC interface circuits, which are labeled "M" and "S" respectively, provide ingress circuits to and egress circuits from the NoC. Each ingress circuit is referred to herein as a "structural NoC ingress" (or "SNI"), and each egress circuit is referred to as a "structural NoC egress" (or "SNE"). A representation of the NoC in a circuit design as a monolithic block having numerous ingress and egress circuits can be difficult to comprehend and difficult to manage between multiple design groups.

The programmable IC 100 can be implemented on a single semiconductor die, and the NoC can be connected to the NoC on another die via an interposer. For example, NoC signal lines 116, 118, and 120 can be connected to adjacent switches in the NoCs of other dies through bridge circuitry (not shown).

Note that FIG. 1 is intended to illustrate only an exemplary programmable IC architecture. The layout and number of switches, programmable logic blocks, interface circuits, memory circuits and processor subsystem are purely exemplary.

Logical NoC

To configure the structural NoC and SoC described above, the designer creates a circuit design that is composed of modules and sub-designs that include LNoCs.

Figure 2:
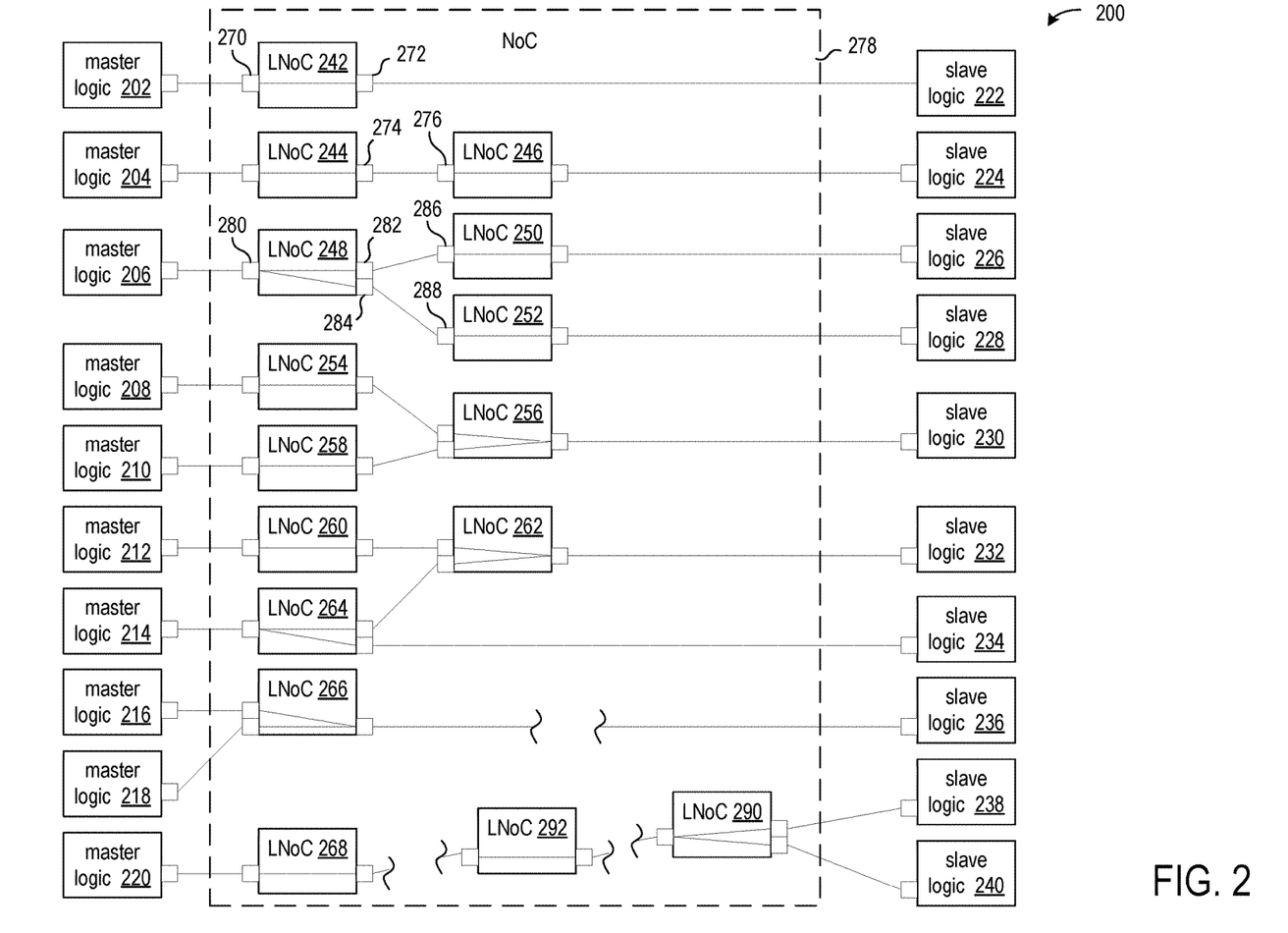
FIG. 2 shows an exemplary circuit design having various arrangements of LNoCs that communicatively couple master logic circuits and slave logic circuits.

FIG. 2 shows an exemplary circuit design 200 having various arrangements of LNoCs that communicatively couple master logic circuits and slave logic circuits. Instead of a monolithic block for specifying connections to the NoC of the target device, multiple LNoCs can be instantiated to specify NoC connections. Dashed block 278 represents the NoC of the target device. Master logic circuits are shown as blocks 202, 204, 206, 208, 210, 212, 214, 216, 218 and 220. Slave logic circuits are shown as blocks 222, 224, 226, 228, 230, 232, 234, 236, 238, and 240. LNoCs are shown as blocks 242, 244, 246, 248, 250, 252, 254, 256, 258, 260, 262, 264, 266, 268, 290, and 292.

An LNoC is a configurable module that can be instantiated in a circuit design for communicatively coupling modules that implement application functions of the circuit design. An LNoC is configurable to include structural and/or logical ports (LPs). A structural port represents a connection to a structural NoC ingress or to a structural NoC egress of the NoC of the target device. The total number of structural ports available for inputs to LNoCs is the total number of structural NoC ingresses. Similarly, the total number of structural ports available for outputs from LNoCs is the total number of structural NoC egresses. A structural port can be configurable with specifications of a connection protocol (e.g., the Advanced eXtensible Interface or "AXI"), bit-widths of address and data ports, and/or other parameters particular to the specified connection protocol. Examples of structural ports are ports 270 and 272 of LNoC 242.

A logical port can be used to connect one LNoC to another LNoC and does not represent either an ingress or an egress of the NoC. Logical ports can be used in LNoCs to specify paths through the NoC for different parts of the design.

The design tool restricts connections from and to logical ports. A logical input port of an LNoC can be connected to one or more logical output ports of the same LNoC, or to one or more structural output ports of the same LNoC. A logical output port of an LNoC can be connected to one and only one logical input port of another LNoC. For example, logical output port 282 can be connected to only one logical input port, which is logical input port 286 in the exemplary path. In contrast to the path having LNoCs 248, 250, and 252, multiple logical output ports of one LNoC could be connected to respective logical input ports of only one other LNoC in a different path (not shown). An LNoC can have any number of logical ports. Examples of logical ports are ports 274 and 276 of LNoCs 244 and 246, respectively.

A path from a structural NoC ingress to a structural NoC egress can be specified by a single LNoC having only structural ports or by multiple LNoCs having structural ports and logical ports. An example of a single LNoC path is shown by LNoC 242. In a path having multiple LNoCs, one LNoC has a structural port for the structural NoC ingress, another LNoC has a structural port for the structural NoC egress, and logical ports connect the LNoCs in the path. For example, LNoCs 244 and 246 communicatively couple master logic circuit 204 to slave logic circuit 224.

A path through the NoC 278 is not limited to two LNoCs. For example, a path can have three or more LNoCs, and one or more LNoCs in the path could have only logical ports. LNoC 292, which could be in a path between LNoCs 268 and 290, is an example of an LNoC having only logical ports. In the path from master logic circuit 220 to slave logic circuit 238, for example, the output logical port of LNoC 268 could be connected (direct connection) to the input logical port of LNoC 292 or coupled through one or more additional LNoCs (not shown). Similarly, the output logic port of LNoC 292 could be connected (direct connection) to the input logical port of LNoC 290 or coupled through one or more additional LNoCs (not shown).

Though a logical port of an LNoC can be connected to one and only one logical port of another LNoC, input to an LNoC can be fanned-out by connecting an input port (logical or structural) of a LNoC to multiple output ports (logical or structural) of that LNoC, and connecting the multiple output ports to slave logic circuits or to multiple logical input ports of one or more other LNoCs. For example, structural input port 280 of LNoC 248 is connected to logical output ports 282 and 284 of LNoC 248, and the logical output ports 282 and 284 are connected to logical input ports 286 and 288 of LNoCs 250 and 252, respectively. LNoC 290 illustrates fan-out from a logical input port of an LNoC. Sharing of paths through the NoC 278 can be achieved through use of fan-in and fan-out available in the LNoCs.

Multiple inputs to an LNoC can be fanned-in to a single output port of that LNoC, and that output port can be a structural output port or a logical output port. The inputs can be structural and/or logical input ports of an LNoC. LNoCs 254, 256, and 258 show paths that communicatively couple master logic circuits 208 and 210 to slave logic circuit 230. The logical output ports of LNoCs 254 and 258 are connected to logical input ports of LNoC 256, which has a structural output port connected to slave logic circuit 230. Another example has master logic circuits 216 and 218 communicatively coupled to slave logic circuit 236 through LNoC 266. LNoC 266 has structural input ports that fan-in to an output port, which as a structural output port can be connected directly to slave logic circuit 236, or as a logical output port coupled indirectly to the slave logic circuit 236 through one or more other LNoCs (not shown). As the design tool imposes one-to-one connections from logical output ports to logical input ports between LNoCs, LNoC 256 has respective logical input ports for connecting to the logical output ports of LNoCs 254 and 258, and LNoC 262 has respective logical input ports for connecting to the logical output ports of LNoCs 260 and 264.

Though not shown, a single LNoC can have a combination of both structual and logical input ports. For example, LNoC 262 could have a structural input port (not shown) from one of the illustrated master logic circuits or from another master logic circuit (not shown), in addition to the illustrated logic input ports. Similarly, an LNoC can have a combination of both structual and logical output ports, such as shown by LNoC 264.

The paths from master logic circuit 214 to slave logic circuits 232 and 234 illustrates that LNoCs can support fan-in and fan-out signals. Signals from master logic circuit 214 are fanned-out by LNoC 264 to LNoC 262 and to slave logic circuit 234, and signals from master logic circuit 212 and 214 are fanned-in by LNoC 262 to slave logic circuit 232.

In an exemplary approach, one type of LNoC can include a physical resource of the target device, with that physical resource being connected to the NoC. For example, the physical resource can be a memory controller that is directly connected to the NoC. An LNoC that includes a physical resource that is an NoC endpoint would not have a corresponding NoC output port, as the physical resource is the endpoint of the path through the NoC.

Design Flow and Aggregation

Figure 3:
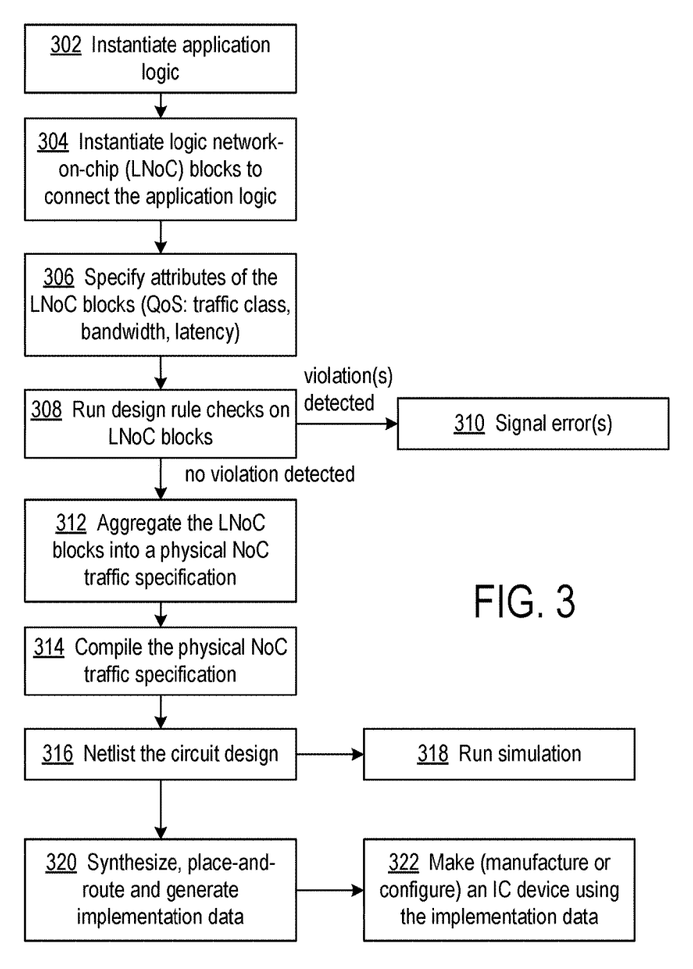
FIG. 3 shows a flowchart of an exemplary design flow process in which LNoCs are available for coupling logic circuits.

FIG. 3 shows a flowchart of an exemplary design flow process in which LNoCs are available for coupling logic circuits. One or more circuit design tools can perform the operations shown in the flowchart. At blocks 302 and 304, the design tool instantiates application logic and LNoCs in response to user input. The circuit design including LNoCs and other inputs specified in FIG. 3 can be captured in a variety of ways, such as through a graphical user interface (GUI)-based design environment (such as Vivado/IPI), through a Hardware Description Language (such as Verilog), or through a scripting language (such as Tcl). LNoCs may also be inferred by a compiler or synthesis tool kit given a high-level language description of an application. The application logic can include logic blocks, which are communicatively coupled through the instantiated LNoCs.

At block 306, the design tool associates quality-of-service (QoS), connectivity, and protocol (e.g., AXI memory mapped or AXI stream) attributes with the LNoCs in response to user input or inferred from surrounding logic (e.g., attributes of the master logic and slave logic circuits). Each path through the NoC can be characterized by a QoS and protocol specification. Examples of attributes of an LNoC can describe a traffic class, bandwidth, and latency. Specific traffic classes can include low latency (a high priority), isochronous (medium priority until timeout reached and then high priority), and best effort (a low priority). The bandwidth attributes can include separate data transfer rates for read and write paths. The latency attributes can include an isochronous latency and an upper bound latency. Bandwidth attributes are per-path through the NoC and can be specified on both structural an logic ports as per-path attributes. Attributes such as traffic class and protocol are per-endpoint and are applicable only to sturcutral ports of an LNoC.

The design tool at block 308 runs design rule checks on the LNoCs. The design rule checks can include, for example, checking whether the total number of structural ports of the LNoCs exceeds the number of ports on the physical NoC in the target device.

Another design rule check can involve location constraints. An LNoC can be configured to include a location constraint. The location constraint can specify ingress and egress points of the NoC in the target IC device. The design tool can check for conflicts between location constraints of separate LNoCs.

In response to detecting a violation(s) of a design rule(s), the design tool can signal an error at block 310 and output data to the user explaining the source of the error. Otherwise, at block 312, the design tool aggregates the specification of LNoCs into a traffic specification. The aggregation process analyzes the set of all LNoCs in the design and constructs a unified traffic specification for the entire design for input to an NoC compiler process. The traffic specification may or may not specify the LNoCs; each path specified by LNoCs may be reduced to specification of a direct connection between a structural NoC ingress (SNI) and a structural NoC egress (SNE).

At block 314, the design tool compiles the traffic specification into configuration parameters for the physical NoC. The configuration parameters are data that specify the contents of control registers in the SNI, SNE, and switches, for example, and the contents of routing tables used by the switches of the physical NoC.

At block 316, the aggregation process may communicate with a netlister process to generate a netlist suitable for synthesis and simulation of the logic portion of the design. The netlist can specify connections between the logic blocks and the ingress and egress ports. The resulting netlist may be simulated using processes applicable to the target IC device at block 318.

The design tool at block 320 synthesizes, places-and-routes, and generates implementation data based on the logic blocks of the design. For example, bitstream generation tools may be executed to generate configuration data for an FPGA. Other tools can generate data from which an application-specific (ASIC) can be fabricated.

At block 322, an IC device can be implemented by way of configuring a programmable IC with configuration data and configuring an NoC with the configuration parameters, or fabricating, making, or producing an ASIC from the implementation data and configuring an NoC with the configuration parameters, thereby creating a circuit that operates according to the resulting circuit design.

Figure 4:
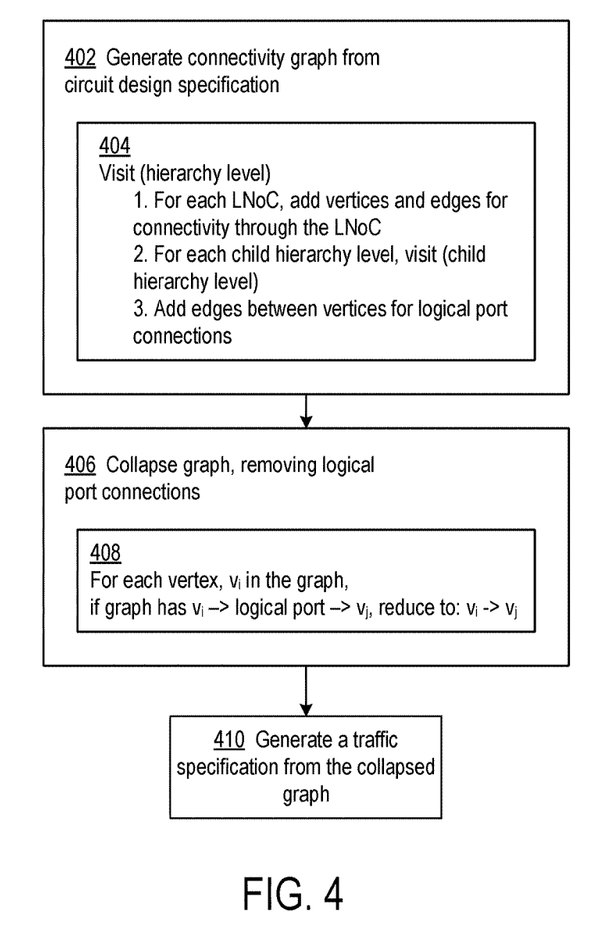
FIG. 4 shows a flowchart of an aggregation process that generates a traffic specification from a circuit design having LNoCs.

FIG. 4 shows a flowchart of an aggregation process that generates a traffic specification from a circuit design having LNoCs. At block 402, the design tool generates a connectivity graph from the circuit design specification. The connectivity graph has vertices that represent ports of the LNoCs, and edges that represent connections between ports of the LNoCs. Example 1 illustrates a definition of the properties of vertices and edges of a connectivity graph involving LNoCs. The graph would also include connectivity data to indicate connections of vertices and edges.

Vertex {
string Inoc_instance_name;
string Inoc_pin_name;
Vertex_type (SNI, SNE, LP), etc.
}
Edge {
QoS bandwidth, etc;
}

Example 1

The vertex types include structural NoC ingress ("SNI"), structural NoC egress ("SNE"), and logical port ("LP"), and variations such as a memory controller type of SNE.

The connectivity graph can be generated according to the process of block 404. For a circuit specification, each block is visited, and for each LNoC encountered, the process adds to the graph a vertex for each port and an edge for each connection between ports of the LNoC. For each hierarchal block encountered, the process recursively visits the contents of the block, and adds additional vertices of LNoCs and edges between vertices to represent connections between LNoCs at the different hierarchical levels. Example 2 shows an example connectivity graph.

Inoc0/SNI→Inoc0/LP→Inoc1/LP→Inoc1/SNE

Example 2

The connectivity graph of Example 2 has LNoCs identified as "Inoc0" and "Inoc1." The graph shows a structural port of Inoc0 ("Inoc0/SNI") connected to a logical output port of Inoc0, the logical output port of Inoc0 is connected to a logical input port of Inoc1, and that logical input port of Inoc1 is connected to a structural output port of Inoc1. The graph can in some implementations include vertices (not shown in Example 2) to represent the master and slave logic circuits.

Once the connectivity graph has been generated, at block 406 the design tool can optionally collapse the graph, removing vertices that represent logical port connections and eliminating associated edges. Instead of collapsing the graph prior to generating the traffic specification, the design tool could first generate the traffic specification from the graph and subsequently remove logical ports from the traffic specification.

The connectivity graph can be collapsed by visiting each vertex in the graph. If the vertex has an edge that connects to a vertex representing a logical port, that vertex is removed from the graph, as specified by block 408. The process is repeated until all logical ports are removed. Example 3 shows the collapsed version of the connectivity graph of Example 2.

noc0/SNI→noc1/SNE

Example 3

At block 410, the design tool generates a traffic specification from the collapsed graph. Example 4 shows a traffic specification stating the required NoC connectivity and QoS requirements of the path from Examples 1, 2, and 3. The format and content of the traffic specification can vary according to physical characteristics of the NoC and implementation of the NoC compiler.

```
{
"LogicalInstances": [
  {
    "Name": "noc0/inst/S00_AXI_SNI"
    Type, traffic_class, addressing, etc.
  },
  {
    "Name": "noc1/inst/M00_AXI_SNE"
  }
],
"Paths": [
  {
    "From": "noc0/inst/S00_AXI_SNI",
    "To": "noc1/inst/M00_AXI_SNE"
    QoS, etc.
  }
]
}
```

Example 4

Network on Chip Architecture

FIG. 5 shows an exemplary switch circuit 500 for routing packets within an NoC. The switch circuit routes input packets, for example, packet 502, using hierarchical destination addresses and hierarchical routing tables. The switch includes multiple input ports shown as ports 504 through 506 and multiple output ports shown as ports 508 through 510. Each input port is coupled to receive input packets, and each output port is coupled to another switch (not shown) or to a destination circuit (not shown). An input packet includes, among other data, a destination address, which specifies a destination chip, a destination region, and a destination interface.

Each input port includes multiple virtual channels. For example, input port 504 is shown as having virtual channels 512 through 514. Each virtual channel includes buffer circuitry and routing circuitry. The buffer circuitry is shown as blocks 516 in virtual channel 512. The buffer circuitry can be implemented as a first-in-first-out buffer circuit, for example. Each virtual channel further includes a respective routing table 518, which includes mapping circuitry 520, 522, and 524. Mapping circuitry 520 implements an interface-to-port map, mapping circuitry 522 implements a region-to-port map, and mapping circuitry 524 implements a chip-to-port map.

The interface-to-port map 520 maps interface identifiers to port identifiers. Each interface identifier identifies one of the destination circuits, and each port identifier identifies one of the output ports of the switch. The region-to-port map 522 maps region identifiers to port identifiers, and each region identifier identifies a particular region of a semiconductor die having destination circuits. The chip-to-port map 524 maps chip identifiers to port identifiers, and each chip identifier identifies one of the semiconductor dies in a multi-die implementation.

A respective lookup circuit is coupled to each virtual channel to receive the destination address in each input packet. In one implementation, the lookup circuit and the mapping circuitry 520, 522, and 524 is replicated on each virtual channel. For example, lookup circuit 526 receives the destination address of an input packet on virtual channel 512, and lookup circuit 528 receives the destination address of an input packet on virtual channel 514. Lookup circuit 528 is coupled to routing table 544, which replicates the mapping circuitry 520, 522, and 524.

Each input port of a switch is paired with an output port of the switch. That is, if an input port of a switch is connected to another switch, the output port of the pair is connected to the same switch. For example, input port 504 is paired with output port 508, and input port 506 is paired with output port 510. In response to an input packet, the lookup circuit of a virtual channel in an input port selects one of the output ports of the switch, other than the output port with which the input port is paired, for outputting the packet. For example, if lookup circuit 526 receives the destination address of an input packet, the lookup circuit selects an output port other than output port 508 for outputting the packet.

The lookup circuit 526 selects an output port based on the destination address in the input packet, the semiconductor die on which the switch is disposed, the region of the semiconductor die in which the switch is disposed, the chip-to-port map 524, the region-to-port map 522, and the interface-to-port map 520. Each lookup circuit is further coupled to memory circuits (not shown) that store the chip identifier 530 that identifies the semiconductor die on which the switch is disposed and the region identifier 532 of the region of the semiconductor die in which the switch is disposed. The memories that store the chip identifier and region identifier can be shared by multiple switches on a chip.

In selecting an output port, the lookup circuit 526 compares the specification of the destination chip in the input packet 502 to the chip identifier 530. If the values do not match, the routing circuit looks up the port identifier in the chip-to-port map 524 using the specification of the destination chip from the input packet. The lookup circuit appends the port identifier to the input packet, which is input to the multiplexer 534. Multiplexer 534 selects a packet from one of the virtual channels 512 through 514 for input to the switch circuit 536. Once the switching is complete and the packet reaches the output port, the port ID is no longer needed and is discarded from the packet.

If the specification of the destination chip in the input packet 502 matches the chip identifier 530, the lookup circuit compares the specification of the destination region in the input packet to the region identifier 532. If the values do not match, the lookup circuit looks up the port identifier in the region-to-port map 522 using the specification of the destination region from the input packet. The lookup circuit adds the port identifier to the input packet, which is input to the multiplexer 534.

If the destination region specified in the input packet 502 matches the region identifier 532, the lookup circuit looks up the port identifier in the interface-to-port map 520 using the specification of the destination interface from the input packet. The lookup circuit adds the port identifier to the input packet, which is input to the multiplexer 534. In one implementation, if the port mapped to the destination interface is the same as the input port on which the packet is received, an interrupt signal (not shown) is generated to indicate an error. Disallowing certain routes through the network provides a measure of security.

The mapping circuitry 520, 522, and 524 can be implemented as memories that are addressed by selected bits of the destination address from the input packet 502. The width of the memories depends on the number of output ports in each switch. For example, for a switch having 4 output ports, the memories would need 2 bits to identify the 4 output ports. The interface-to-port memory 520 can be addressed by the destination interface bits of the destination address, the region-to-port memory 522 can be addressed by the destination region of the destination address, and the chip-to-port memory 524 can be addressed by the destination chip of the destination address.

Each input port has an input de-multiplexer and an output multiplexer. The input de-multiplexer selects one of the virtual channels to buffer the input packet in response to control signals from the control/arbitration circuit 538. The multiplexer selects an input packet from one of the virtual channels for input to the switch circuit 536 in response to control signals from the control/arbitration circuit. For example, in input port 504, input de-multiplexer 540 selects one of the virtual channels 512 through 514 to buffer the input packet, and output multiplexer 534 selects an input packet from one of the virtual channels 512 through 514. The control/arbitration circuit generally tracks the fill levels of the buffers 516 in each of the virtual channels and the flow control credits 542 as signaled from the next switch, which indicate availability of buffer space in the virtual channels in the connected switches. The control/arbitration circuit selects one of the virtual channels 512 through 514 for receiving an input packet and selecting one of the virtual channels 512 through 514 to provide an input packet to the switch circuit 536.

Figure 6:
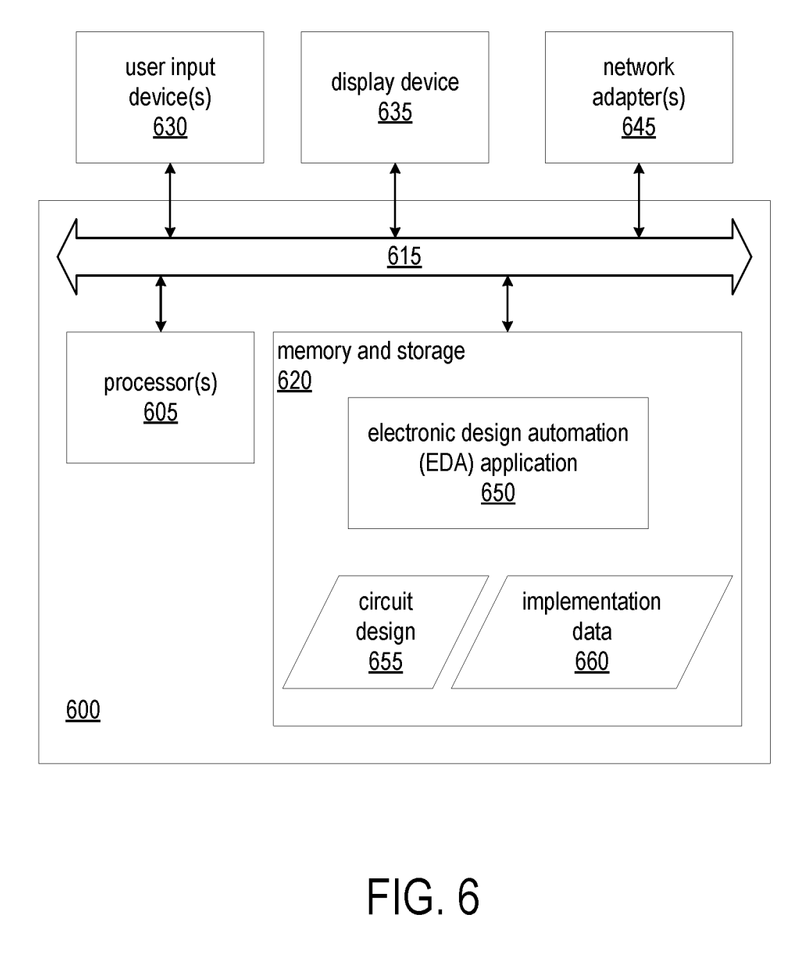
FIG. 6 is a block diagram illustrating an exemplary data processing system.

FIG. 6 is a block diagram illustrating an exemplary data processing system (system) 600. System 600 is an example of an EDA system. As pictured, system 600 includes at least one processor circuit (or "processor"), e.g., a central processing unit (CPU) 605 coupled to memory and storage arrangement 620 through a system bus 615 or other suitable circuitry. System 600 stores program code and circuit design 655 within memory and storage arrangement 620. Processor 605 executes the program code accessed from the memory and storage arrangement 620 via system bus 615. In one aspect, system 600 is implemented as a computer or other data processing system that is suitable for storing and/or executing program code. It should be appreciated, however, that system 600 can be implemented in the form of any system including a processor and memory that is capable of performing the functions described within this disclosure.

Memory and storage arrangement 620 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 600 may also include one or more cache memories (not shown) that provide temporary storage of at least some program code and data in order to reduce the number of times program code and data must be retrieved from local memory and persistent storage during execution.

Input/output (I/O) devices such as user input device(s) 630 and a display device 635 may be optionally coupled to system 600. The I/O devices may be coupled to system 600 either directly or through intervening I/O controllers. A network adapter 645 also can be coupled to system 600 in order to couple system 600 to other systems, computer systems, remote printers, and/or remote storage devices through intervening private or public networks. Modems, cable modems, Ethernet cards, and wireless transceivers are examples of different types of network adapter(s) 645 that can be used with system 600.

Memory and storage arrangement 620 may store an EDA application 650. EDA application 650, being implemented in the form of executable program code, is executed by processor(s) 605. As such, EDA application 650 is considered part of system 600. System 600, while executing EDA application 650, receives and operates on circuit design 655. In one aspect, system 600 performs a design flow on circuit design 655, and the design flow can include design capture, synthesis, mapping, placement, and routing, and the application of one or more physical optimization techniques. The design capture and synthesis phases can include the processing of LNoCs as described herein. System 600 generates implementation 660, which can include configuration parameters for an NoC and configuration data for configuring a programmable IC or data for making an ASIC.

EDA application 650, circuit design 655, implementation data 660, and any data items used, generated, and/or operated upon by EDA application 650 are functional data structures that impart functionality when employed as part of system 600 or when such elements, including derivations and/or modifications thereof, are loaded into a programmable IC or used to make an ASIC, causing implementation of the circuit design within the IC device.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for preparing circuit designs for target devices having NoCs. Other aspects and features will be apparent to those skilled in the art from consideration of the specification. It is intended that the specification and drawings be considered as examples only, with a true scope of the invention being indicated by the following claims.

What is claimed is:

1. A method comprising:
instantiating in a memory of a computer system by a computer processor in response to user input, a plurality of logic blocks and a plurality of logical network-on-chip (LNoC) blocks, wherein each logic block specifies a function of a circuit design, and each logic block is communicatively coupled to another logic block through a set of one or more LNoC blocks of the plurality of LNoC blocks;
aggregating the plurality of LNoC blocks into a traffic specification in the memory by the computer processor, wherein the aggregating includes reducing each set of LNoC blocks to a connection between one ingress circuit and one egress circuit of the NoC, and the traffic specification specifies connections between ingress circuits and egress circuits of an NoC of a target integrated circuit (IC) device;
compiling the traffic specification by the computer processor into configuration parameters for switch circuits of the NoC;
compiling the logic blocks into implementation data for the target IC by the computer processor; and
configuring the target IC with the configuration parameters and implementation data.

2. The method of claim 1, further comprising:
associating quality-of-service (QoS) attributes with each connection specified by each LNoC block in response to user input; and
wherein the aggregating includes associating the QoS attributes with the connections.

3. The method of claim 1, further comprising:
associating quality-of-service (QoS) attributes with each connection specified by each LNoC block in response to attributes associated with logic coupled to the connection; and
wherein the aggregating includes associating the QoS attributes with the connections.

4. The method of claim 1, wherein:
for at least one pair of the plurality of logic blocks is communicatively coupled through a set of two or more LNoC blocks; and
the aggregating includes reducing the two or more LNoC blocks to a connection between an ingress circuit and an egress circuit of the NoC.

5. The method of claim 4, wherein:
the instantiating includes instantiating a pair of the at least one pair of logic blocks that includes a first logic block and a second logic block;
the instantiating of the two or more LNoC blocks includes instantiating a first LNoC block and a second LNoC block;
the first LNoC block includes a structural port connected to the first logic block and a logical port connected to the second LNoC block; and the second LNoC block includes a logical port connected to the first LNoC block and a structural port connected to the second logic block.

6. The method of claim 1, wherein:
the instantiating includes, for at least one pair of the plurality of logic blocks, instantiating three or more LNoC blocks that communicatively couple the at least one pair of logic blocks;
a pair of the at least one pair of logic blocks includes a first logic block and a second logic block;
the three or more LNoC blocks include a first LNoC block, a second LNoC block, and a third LNoC block;
the first LNoC block includes a structural port connected to the first logic block;
the second LNoC block includes a structural port connected to the second logic block;
the third LNoC block includes a logical input port coupled to a logical output port of the first LNoC block, and a logical output port coupled to a logical input port of the second LNoC block; and
the aggregating includes reducing the three or more LNoC blocks to a connection between an ingress circuit and an egress circuit of the NoC.

7. The method of claim 1, wherein:
the instantiating includes, for at least one pair of the plurality of logic blocks, instantiating one LNoC block that communicatively couples the one pair of logic blocks;
a pair of the at least one pair of logic blocks includes a first logic block and a second logic block;
the one LNoC block includes a structural input port connected to the first logic block and a structural output port connected to the second logic block; and
the aggregating includes reducing the one LNoC block to a connection between an ingress circuit and an egress circuit of the NoC.

8. The method of claim 1, wherein:
the instantiating includes, for a first logic block, a second logic block, and a third logic block of the plurality of logic blocks, instantiating one or more LNoC blocks that communicatively couple the first logic block to the second logic block and communicatively couple the third logic block to the second logic block;
an LNoC block of the one or more LNoC blocks has first and second input ports and an output port, the first input port is coupled to the first logic block, the second input port is coupled to the third logic block, the output port is coupled to the second logic block, and the first and second input ports are connected to the output port; and
the aggregating includes reducing the one or more LNoC blocks to a first connection between a first ingress circuit and an egress circuit of the NoC and a second connection between a second ingress circuit and the egress circuit of the NoC.

9. The method of claim 1, wherein:
the instantiating includes, for a first logic block, a second logic block, and a third logic block of the plurality of logic blocks, instantiating one or more LNoC blocks that communicatively couple the first logic block to the second logic block and to the third logic block;
an LNoC block of the one or more LNoC blocks has an input port and first and second output ports, the input port is coupled to the first logic block, the first output port is coupled to the second logic block, the second output port is coupled to the third logic block, and the input port is connected to the first and second output ports; and the aggregating includes reducing the one or more LNoC blocks to a first connection between an ingress circuit and a first egress circuit of the NoC and a second connection between the ingress circuit and a second egress circuit of the NoC.

10. The method of claim 1, wherein:
the instantiating includes, for a first logic block, a second logic block, and a third logic block of the plurality of logic blocks, instantiating two or more LNoC blocks that communicatively couple the first logic block to the second logic block and to the third logic block;
the two or more LNoC blocks include a first LNoC block having a structural input port connected to the first logic block, and a logical output port connected to a logical input port of another LNoC block of the two or more LNoC blocks;
the two or more LNoC blocks include a second LNoC block having structural output ports connected to the second logic block and a third logic block, and a logical input port connected to a logical output port of another LNoC block of the two or more LNoC blocks; and
restricting each logical output port of each LNoC block of the two or more LNoC blocks to connection with one and only one logical input port of another LNoC block of the two or more LNoC blocks.

11. The method of claim 1, wherein:
the instantiating includes, for a first logic block, a second logic block, and a third logic block of the plurality of logic blocks, instantiating two or more LNoC blocks that communicatively couple the first logic block and the second logic block to the third logic block;
the two or more LNoC blocks include a first LNoC block having structural input ports connected to the first logic block and a second logic block, and a logical output port connected to a logical input port of another LNoC block of the two or more LNoC blocks;
the two or more LNoC blocks include a second LNoC block having a structural output port connected to the third logic block, and a logical input port connected to a logical output port of another LNoC block of the two or more LNoC blocks; and
restricting each logical input port of each LNoC block of the two or more LNoC blocks to connection with one and only one logical output port of another LNoC block of the two or more LNoC blocks.

12. The method of claim 1, further comprising:
checking by the computer processor for violations of design rules by the plurality of logic blocks and plurality of LNoC blocks; and
signaling an error in response to detecting a violation of one or more of the design rules.

13. The method of claim 1, wherein:
the instantiating includes, for at least one pair of the plurality of logic blocks, instantiating two or more LNoC blocks that communicatively couple the at least one pair of logic blocks; and
the aggregating includes generating a connectivity graph in the memory from the plurality of logic blocks and the plurality of LNoC blocks, wherein the connectivity graph has vertices that represent ports of the LNoC blocks and edges that represent connection between the ports of the LNoC blocks.

14. The method of claim 13, wherein the aggregating includes collapsing the connectivity graph into a collapsed graph that eliminates edges that represent connections between the two or more LNoC blocks.

15. A system comprising:

a computer processor;

a memory arrangement coupled to the computer processor and configured with instructions that when executed by the computer processor cause the computer processor to perform operations including:

instantiating in the memory in response to user input, a plurality of logic blocks and a plurality of logical network-on-chip (LNoC) blocks, wherein each logic block specifies a function of a circuit design, and each logic block is communicatively coupled to another logic block through a set of one or more LNoC blocks of the plurality of LNoC blocks;

aggregating the plurality of LNoC blocks into a traffic specification in the memory by the computer processor, wherein the aggregating includes reducing each set of LNoC blocks to a connection between one ingress circuit and one egress circuit of the NoC, and the traffic specification specifies connections between ingress circuits and egress circuits of an NoC of a target integrated circuit (IC) device;

compiling the traffic specification by the computer processor into configuration parameters for switch circuits of the NoC;

compiling the logic blocks into implementation data for the target IC; and configuring the target IC with the configuration parameters and implementation data.

16. The system of claim 15, wherein the memory arrangement is configured with instructions that when executed by the computer processor cause the computer processor to perform operations comprising:

associating quality-of-service (QoS) attributes with each connection specified by each LNoC block in response to user input; and wherein the instructions for aggregating include instructions that cause the computer processor to associate the QoS attributes with the connections.

17. The system of claim 15, wherein the memory arrangement is configured with instructions that when executed by the computer processor cause the computer processor to perform operations comprising:

associating quality-of-service (QoS) attributes with each connection specified by each LNoC block in response to attributes associated with logic coupled to the connection; and wherein the instructions for aggregating include instructions that cause the computer processor to associating the QoS attributes with the connections.

18. The system of claim 15, wherein:

at least one pair of the plurality of logic blocks is communicatively coupled through a set of two or more LNoC blocks; and the instructions for aggregating include instructions that cause the computer processor to reduce the two or more LNoC blocks to a connection between an ingress circuit and an egress circuit of the NoC.

19. The system of claim 18, wherein:

the instructions for instantiating include instructions that cause the computer processor to instantiate a pair of the at least one pair of logic blocks that includes a first logic block and a second logic block;

the instructions for instantiating the two or more LNoC blocks include instructions that cause the computer processor to instantiate a first LNoC block and a second LNoC block;

the first LNoC block includes a structural port connected to the first logic block and a logical port connected to the second LNoC block; and the second LNoC block includes a logical port connected to the first LNoC block and a structural port connected to the second logic block.

20. The system of claim 15, wherein:

the instructions for instantiating include instructions that cause the computer processor to, for at least one pair of the plurality of logic blocks, instantiate three or more LNoC blocks that communicatively couple the at least one pair of logic blocks;

a pair of the at least one pair of logic blocks includes a first logic block and a second logic block;

the three or more LNoC blocks include a first LNoC block, a second LNoC block, and a third LNoC block;

the first LNoC block includes a structural port connected to the first logic block;

the second LNoC block includes a structural port connected to the second logic block;

the third LNoC block includes a logical input port coupled to a logical output port of the first LNoC block, and a logical output port coupled to a logical input port of the second LNoC block; and the instructions for aggregating include instructions that cause the computer processor to reduce the three or more LNoC blocks to a connection between an ingress circuit and an egress circuit of the NoC.

* * * * *